United States Patent

Gardner et al.

[11] Patent Number: 6,075,268
[45] Date of Patent: Jun. 13, 2000

[54] ULTRA HIGH DENSITY INVERTER USING A STACKED TRANSISTOR ARRANGEMENT

[75] Inventors: Mark I. Gardner, Cedar Creek; Daniel Kadosh, Austin, both of Tex.

[73] Assignee: Advanced Micro Devices, Inc., Sunnyvale, Calif.

[21] Appl. No.: 09/188,972

[22] Filed: Nov. 10, 1998

Related U.S. Application Data

[62] Division of application No. 08/744,402, Nov. 7, 1996.

[51] Int. Cl.7 .................... H01L 29/76; H01L 29/94; H01L 31/062; H01L 23/02; H01L 31/119
[52] U.S. Cl. ................... 257/327; 257/413; 257/369; 257/686; 257/365
[58] Field of Search .................. 257/278, 413, 257/369, 686, 67, 69, 266, 365, 758, 350, 351; 438/152, 154, 157, 283, 327

[56] References Cited

U.S. PATENT DOCUMENTS

| | | |
|---|---|---|
| 4,381,201 | 4/1983 | Sakurai . |
| 4,489,478 | 12/1984 | Sakurai . |
| 4,498,226 | 2/1985 | Inoue et al. . |
| 4,603,468 | 8/1986 | Lam . |
| 4,630,089 | 12/1986 | Sasaki et al. . |
| 4,654,121 | 3/1987 | Miller et al. . |
| 4,654,131 | 3/1987 | Verbaan . |
| 4,669,062 | 5/1987 | Nakano . |
| 4,679,299 | 7/1987 | Szluk et al. . |
| 4,686,758 | 8/1987 | Liu et al. . |
| 4,698,659 | 10/1987 | Mizutani . |
| 4,768,076 | 8/1988 | Aoki et al. . |
| 4,902,637 | 2/1990 | Kondou et al. . |
| 5,122,476 | 6/1992 | Fazan et al. . |
| 5,172,203 | 12/1992 | Hayashi . |
| 5,214,295 | 5/1993 | Manning . |
| 5,215,932 | 6/1993 | Manning ........................ 437/41 |
| 5,266,511 | 11/1993 | Takao . |
| 5,334,682 | 8/1994 | Marolewski et al. . |
| 5,341,028 | 8/1994 | Yamaguchi et al. . |
| 5,348,899 | 9/1994 | Dennison et al. . |
| 5,352,623 | 10/1994 | Kamiyama . |
| 5,365,081 | 11/1994 | Yamazaki et al. . |

(List continued on next page.)

OTHER PUBLICATIONS

Japan Patent Abstract, publication No. 59–227139, published Dec. 20, 1984.
Japan Patent Abstract, publication No. 60–186051, published Sep. 21, 1985.

(List continued on next page.)

*Primary Examiner*—David Hardy
*Assistant Examiner*—Jesse A. Fenty
*Attorney, Agent, or Firm*—Kevin L. Daffer; Conley, Rose & Tayon

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds the to the overall circuit density, but does so with emphasis placed on high performance interconnection between devices on separate levels. The interconnect configuration is made as short as possible between features within one transistor level to features within another transistor level. This interconnect scheme lowers resistivity by forming a gate conductor of an upper level transistor upon a gate conductor of lower level transistor. Alternatively, the gate conductors can be a single conductive entity. In order to abut the gate conductors together, or form a single gate conductor, the upper level transistor is inverted relative to the lower level transistor. In addition to the inverted, shared gate conductor, the multi-level transistor fabrication process incorporates formation of openings and filling of those openings to produce interconnect to junctions of the upper/lower transistors. Interconnecting the gate conductors of a pair of stacked transistors and connecting specific junctions of those transistors allows formation of a high density inverter circuit hereof.

11 Claims, 4 Drawing Sheets

U.S. PATENT DOCUMENTS

| | | |
|---|---|---|
| 5,411,909 | 5/1995 | Manning et al. . |
| 5,418,177 | 5/1995 | Choi . |
| 5,418,393 | 5/1995 | Hayden .................................. 257/347 |
| 5,424,235 | 6/1995 | Nishihara . |
| 5,470,776 | 11/1995 | Ryou . |
| 5,483,083 | 1/1996 | Meguro et al. . |
| 5,492,851 | 2/1996 | Ryou . |
| 5,521,401 | 5/1996 | Zamanian et al. . |
| 5,606,186 | 2/1997 | Noda . |
| 5,610,094 | 3/1997 | Ozaki et al. . |
| 5,612,552 | 3/1997 | Owens . |
| 5,616,934 | 4/1997 | Dennison et al. . |
| 5,624,862 | 4/1997 | An . |
| 5,714,394 | 2/1998 | Kadosh et al. . |
| 5,731,217 | 3/1998 | Kadosh et al. . |
| 5,744,384 | 4/1998 | Adler et al. . |
| 5,747,367 | 5/1998 | Kadosh et al. .......................... 438/152 |
| 5,770,482 | 6/1998 | Kadosh et al. . |
| 5,770,483 | 6/1998 | Kadosh et al. . |
| 5,808,319 | 9/1998 | Gardner et al. . |
| 5,818,069 | 10/1998 | Kadosh et al. . |
| 5,834,341 | 11/1998 | Chen . |
| 5,834,354 | 11/1998 | Kadosh et al. . |
| 5,852,310 | 12/1998 | Kadosh et al. . |
| 5,863,818 | 1/1999 | Kadosh et al. .......................... 438/152 |
| 5,872,029 | 2/1999 | Gardner et al. . |
| 5,882,959 | 3/1999 | Kadosh et al. . |
| 5,926,700 | 7/1999 | Gardner et al. . |

OTHER PUBLICATIONS

Japan Patent Abstract, publication No. 04–152566, published May 26, 1992.

Japan Patent Abstract, publication No. 62–145850, published Jun. 29, 1987.

Japan Patent Abstract, publication No. 61–196569, published Aug. 30, 1986.

Japan Patent Abstract, publication No. 56–125868, published Oct. 2, 1981.

Wolf et al., "Silicon Processing for the VLSI Era, vol. 1: Process Technology," Lattice Press 1986, p. 195.

Wolf, "Silicon Processing for the VLSI Era, vol. 2: Process Integration," Lattice Press 1990, pp. 144–147, 393–399, and 572–581.

ULTRA HIGH DENSITY INVERTER USING A STACKED TRANSISTOR ARRANGEMENT

This application is a division of application Ser. No. 08/744,402, filed Nov. 7, 1996.

BACKGROUND OF THE INVENTION

1. Field of the Invention

This invention relates to integrated circuit manufacture and more particularly to transistors formed on separate elevational levels and interconnect arranged between transistors to configure an inverter.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS (NMOS) transistor employs n-type junctions placed into a p-type substrate. Conversely, a typical p-channel MOS (PMOS) transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite the junction in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0 $\mu$m critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefor be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

Before a multi-level transistor fabrication process can be introduced, however, the process must pay careful attention to the interconnection between transistors placed on separate levels. Therefore, it is desirable to derive an interconnect scheme which can connect various features on one elevation (topological) level to features on another level. That interconnection must be as short as possible in order to minimize resistance in critical routing conductors between transistors. The desired fabrication process must therefore incorporate not only multi-level fabrication but also high performance interconnect routing as an essential part of that process.

Most logic block portions of an integrated circuit comprise transistors interconnected in various ways. For example, combinatorial logic includes NAND gates, NOR gates, and inverters connected in various ways to achieve the stated logic goal. Associated with each of these structures are at least two transistors whose gates are mutually connected. Thus, it would be desirable to incorporate the transistor pair on separate elevation levels but with a relatively short interconnect shared by the gate inputs to the transistor pair. For example, an inverter arrangement employs a pair of PMOS and NMOS transistors having a single input conductor linking the gate conductors of the transistor pair. Likewise, NAND and NOR generally employ two pairs of PMOS and NMOS transistors, wherein the gate conductors of each pair are linked by a single input conductor. To operate as a high performance input conductor, the resistance and capacitance of that conductor must be as small as possible to lessen the load seen by the upstream circuit.

In addition to limiting the routing length of the single input conductor, it would be of further benefit to use short interconnect at linkages to select transistor junctions. For example, interconnecting a junction of one transistor to a junction of another transistor arranged on an altogether different elevation level would be beneficial if the interconnect were designated as an output conductor. Not only must the output conductor be relatively short for performance reasons, but the conductors (power conductors) routed to power junctions and the conductors (ground conductors)

routed to ground junctions must also be short. Therefore, similar to the input conductor linking the input pairs of transistors, conductors used to bring an output from a logic gate, or to couple power or ground to the logic gate must operate under high performance conditions with minimal propagation delay, voltage variance/degradation, etc. Without a mechanism to achieve high speed interconnection at mutually connected gate conductors or at mutually interconnected junctions, multi-level fabrication is limited in its appeal.

SUMMARY OF THE INVENTION

The problems outlined above are in large part solved by a multi-level transistor fabrication technique. The present technique can produce one or more active or passive devices on a first level, followed by one or more active or passive devices on a second level. The first level is substantially planar and extends across an entire wafer surface. The second level is also substantially planar and parallel to the first level, but spaced by a dielectric therefrom.

According to a preferred embodiment, the multi-level transistor fabrication technique is suitable for producing at least one transistor on the first level and at least one transistor on the second level. As such, a first transistor can be formed on a first level followed by a second transistor formed on a second level, both of which have gate conductors which are interconnected. The gate conductor of the first transistor extends upward and has an upper surface which can be contacted by a downward extending lower surface of the second transistor gate conductor. Accordingly, the second transistor is inverted relative to the first transistor. The juncture between the first and second transistor gate conductor preferably employs a silicide. The silicide is formed upon the first level transistor polysilicon prior to depositing the second level transistor gate conductor. Silicide interposed between the gate conductors helps to reduce interconnect resistivity for the benefit of achieving a higher performance interconnect.

The process of forming the first and second transistors, and interconnecting the gate conductors of those transistors is replicated and equally applicable to numerous other transistors arranged on the first and second levels. Thus, according to a preferred embodiment, paired gate conductors are interconnected by inverting one transistor of the pair relative to the other transistor. The inverted transistor includes a gate conductor disposed directly on top of its respectively coupled non-inverted transistor.

By interconnecting gate conductor pairs, the present technique is applicable to any logic block which requires mutually connected gate conductors. For instance, the present process is applicable to the interconnection of gate conductors within an inverter, a NAND gate or a NOR gate. More importantly, however, is the relatively short interconnection used to link the gate conductors. Instead of having to route interconnection along a topological surface as in conventional designs, the present interconnection simply avoids intermediate routing altogether or, at most, simply includes a silicide as the intermediate material. The silicide is preferably used to enhance connectivity by demonstratively reducing the associated resistance and capacitance values (i.e., load) as seen by the upstream circuit.

The present multi-level transistor fabrication technique not only employs low resistance/capacitance gate interconnection between transistors on separate elevational levels, but also advantageously interconnects junction regions of those transistors. Interconnect at select junction regions allows, for example, an upper transistor junction to be connected to a lower transistor junction, a lower transistor junction to be connected to ground or power, and/or an upper transistor junction to be connected to ground or power. In either instance, the interconnection of junction regions is performed by relatively short vertical vias which extend directly through one or more interlevel dielectrics. The vertical vias form the shortest path between junctions arranged on separate elevational levels.

An output conductor is formed, according to a preferred embodiment, between a lower transistor junction and an upper transistor junction. The output conductor is indigenous to the output of a transistor pair found in either an inverter, a NAND gate or a NOR gate. If the output conductor is the output of an inverter, no further coupling is needed. However, if the output conductor is the output of a NAND gate or NOR gate, the output conductor generally requires connection to another output conductor arranged between another pair of multi-level transistors. The output conductor forms an interconnection of the transistor pairs by linking an upper surface of a lower transistor junction to a lateral surface of an upper transistor junctions. The connectable surface of the upper transistor junction is the outer periphery of the junction implant area as measured away from the transistor channel area. Linkage of transistor pair junctions is necessitated by aligning the lateral edge of the upper transistor junction approximately above a middle portion of the lower transistor junction. Interconnecting the junction pairs with the output conductor (i) provides interconnection of drain implant areas within an inverter-coupled pair of transistors, or (ii) provides interconnection of drain implant areas within two pairs of series-connected and parallel-connected transistors of a NAND gate or NOR gate configuration.

Other junction vias besides an output via maybe needed to complete the formation of an inverter, NAND gate or NOR gate. For example, a power conductor may extend in a vertical direction to a source junction of a PMOS device, while a ground conductor can extend to a source junction of an NMOS device. The power and ground conductors, like the output conductor, extend in a direct path substantially perpendicular to the elevational levels on which the multi-level transistors are formed. The power and ground conductors can extend through either a single interlevel dielectric or a pair of interlevel dielectrics depending upon whether the to-be-connected target junction is on the upper of lower level transistor.

Broadly speaking, the present invention contemplates a method for forming an inverter. The method includes the steps of providing a first substrate having junction regions defined as source or drain implant areas. The junction regions within the first substrate are defined as a firs t source implant and a first drain implant. The first substrate further includes a first gate conductor formed between the first source implant and the first drain implant. A first interlevel dielectric is deposited upon the first source implant, upon the first drain implant and upon the first gate conductor. An opening is formed through the interlevel dielectric to the first late conductor (preferably a silicide-covered first gate conductor). The opening is then filled with a second gate conductor, and a gate dielectric is then formed upon the second gate conductor. A second substrate is patterned upon the gate conductor, and a second source implant as well as a second drain implant are then configured into the second substrate. A second interlevel dielectric is then deposited on the second substrate. An output conductor of the inverter is then formed through the first and second interlevel dielectrics. The output conductor is situated to abut against both the first and second drain implants. A power supply conductor is also formed which extends through the second interlevel dielectric to the second source implant. Yet further, a ground conductor is formed to extend through the first and second interlevel dielectric to the first source implant.

The present invention further contemplates an integrated circuit. The integrated circuit comprises a first transistor having a first source implant, a first drain implant and a first gate conductor arranged upon a first topography. A first interlevel dielectric extends over the first topography. The first interlevel dielectric includes an opening through the interlevel dielectric which exposes the first gate conductor. A second transistor extends over the first interlevel dielectric. The second transistor includes a second source implant, a second drain implant and a second gate conductor. The second gate conductor is configured to extend below the second source and drain implants and into the opening of the first interlevel dielectric. An output conductor extends between a lateral edge of the second drain implant in an upper surface of the first drain implant.

The first gate conductor of the first transistor extends along a plane above the first source and drain implants. The second gate conductor of the second transistor extends along a plane below the second source and drain implants. Without having to route intermediate conductive elements along a topological surface, the second gate conductor is brought in electrical communication with the first gate conductor. An output conductor extends between a lateral edge of the second drain implant and an upper surface of the first drain implant. The second drain and source implants are doped with an impurity opposite the first drain and source implants. Preferably, the second transistor is a PMOS transistor having a source junction connected to power, and the first transistor is an NMOS transistor having a source junction connected to ground. Both the PMOS and NMOS transistor drain junctions connect to the output conductor.

BRIEF DESCRIPTION OF THE DRAWINGS

Other objects and advantages of the invention will become apparent upon reading the following detailed description and upon reference to the accompanying drawings in which.

Figure 1:
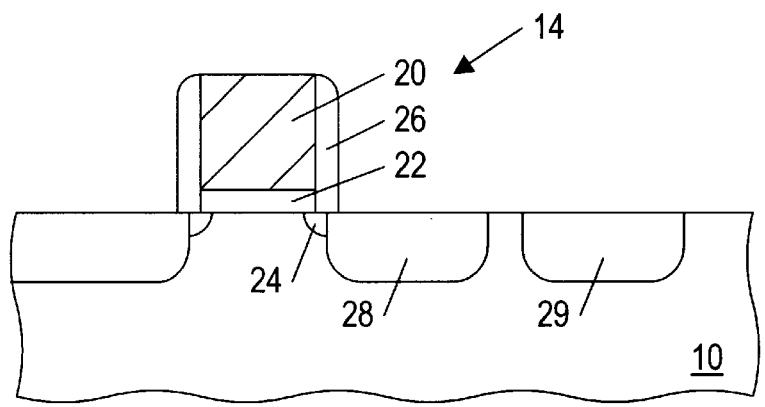
FIG. 1 is a partial cross-sectional view of a semiconductor substrate having a first transistor formed upon and within the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial cross-sectional view of a semiconductor substrate 10. Substrate 10 is preferably a silicon-based, single crystalline material doped either n-type or p-type. Arranged on the upper surface of substrate 10 can be various isolation structures (not shown). Isolation structures can be formed either by the shallow trench process or the LOCOS process. In either event, isolation structures serve to isolate an active or passive device in one portion of substrate 10 from an active or passive device within another portion of substrate 10.

An example of one active device formed between isolation structures is provided in reference to numeral 14. Device 14 is shown as a first transistor formed upon and within the upper surface of substrate 10. First transistor 14 includes, according to one embodiment, a gate conductor 20 and a gate dielectric 22. Gate conductor 20, in combination with adjacent isolation structures, serve to mask implant of a lightly doped drain 24 ("LDD") into the regions therebetween. Thereafter, a CVD oxide is deposited across the topography, including the LDD implant areas 24. The CVD oxide is then removed using an anisotropic etch. Resulting from the anisotropic etch, oxide spacers 26 remain on opposing side wall surfaces of conductor 20. Spacers 26, as well as isolation structures 12, serve to mask implant of source/drain impurities. The source/drain implant 28, in conjunction with LDD implant 24, comprises a junction, wherein the term "junction" conotates either a source region or a drain region.

During the implant process, another implant 29 can be formed. Implant 29 is a region which receives implant species of the same type as those in the bulk of substrate 10. Implant 29 is a high concentration implant area. For example, if substrate 10 comprises p-type species, then implant 29 comprises a higher concentration of p-type species (often referred to as a p+implant). Implant 29 thusly formed is often referred to as a "well-tie" implant. It serves to receive a contact subsequently formed and for providing a low resistive path from the contact to the substrate. Thus, substrate 10 shown in FIG. 1 is possibly only a small portion of the entire wafer substrate, i.e., a well portion of that wafer substrate. The use of wells in general and the formation of a well-tie implant within each well are concepts that are known to those skilled in the art. Provision of wells and contacts thereto make available the present process to CMOS technologies.

Figure 2:
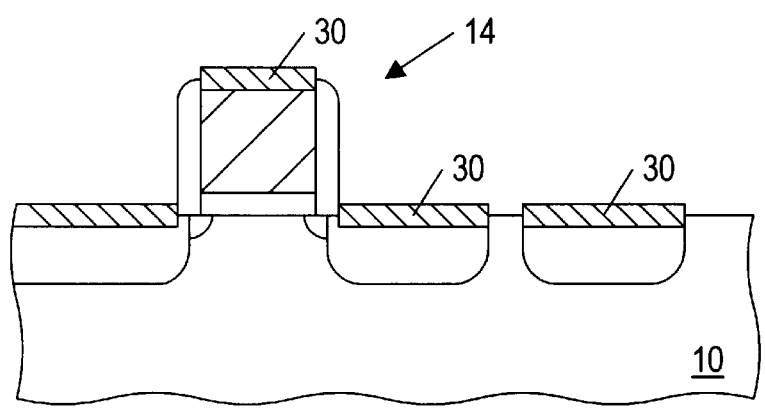
FIG. 2 is a partial cross-sectional view of the semiconductor substrate having silicide formed in silicon-exposed regions according to a processing step subsequent to FIG. 1.

Junction areas serve to receive various suicides shown in reference to FIG. 2. The silicides help reduce contact resistivity of metal conductors forwarded to the junctions. Silicides are shown in reference to as numeral 30, and are formed anywhere where silicon is present. Silicides 30 primarily exist on the silicon-based junctions 28, the silicon based well-ties 29, as well as the polysilicon gate conductor 20. Silicides 30 upon polysilicon are often referred to as "polycide". Regardless of where the silicides are formed, the process sequence used in producing silicide is generally the same. First the silicon-based material receives a refractory metal. Second, the metal covered, silicon-based material is subjected to a high temperature anneal cycle. The anneal cycle allows movement of the silicon and refractory metal atoms so that a metal silicide occurs. The anneal cycle is often repeated to achieve a first phase silicide, followed by a second phase silicide. The second phase silicide is generally of lower resistivity than the first phase silicide. In the interim, however, non-reacted refractory metal is removed from areas typically in regions over oxide.

Figure 3:
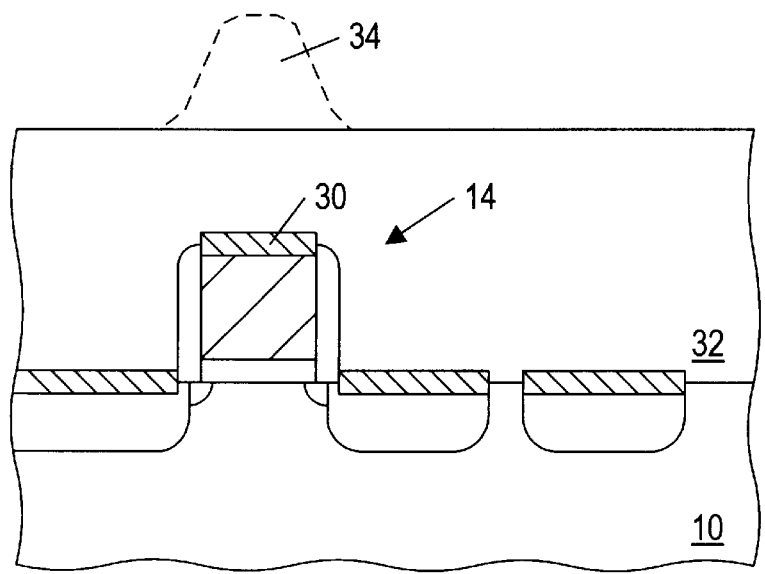
FIG. 3 is a partial cross-sectional view of the semiconductor substrate having an interlevel dielectric placed over the first transistor according to a processing step subsequent to FIG. 2.

Referring to FIG. 3, a processing step subsequent to FIG. 2 is shown. In particular, FIG. 3 illustrates an interlevel dielectric 32 deposited across the first topography onto which, and into which, first transistor 14 resides. Interlevel dielectric 32 can be deposited in numerous ways. Preferably, dielectric 32 is deposited as an oxide using CVD techniques. According to one embodiment, dielectric 32 is deposited using plasma enhanced CVD to a thickness sufficient to isolate transistor 14 from certain devices subsequently placed upon and within dielectric 32. Dielectric 32 is also deposited at a thickness sufficient to define the thickness of a subsequently placed gate conductor attributable to a second level transistor.

In preparation for second level devices, dielectric 32 is preferably planarized after it is deposited. According to one embodiment, peak elevation regions 34 of dielectric 32 are removed by chemical mechanical polishing ("CMP"). CMP utilizes a slurry material and a polishing pad placed on the exposed surface, whereby the pad rotates and removes the upper surfaces commensurate with the lower surfaces. According to another embodiment, the upper surfaces 34 are removed using a sacrificial etch back. In this instance, a sacrificial material is placed on the upper surface such that the recesses or valleys are filled with that material. The material upper surface is then removed at an etch rate substantially the same as the dielectric underlayer. When all of the sacrificial material is removed, the remaining dielectric surface is approximately planar in that it takes on the same contours as the planar surface of the sacrificial material.

Figure 4:
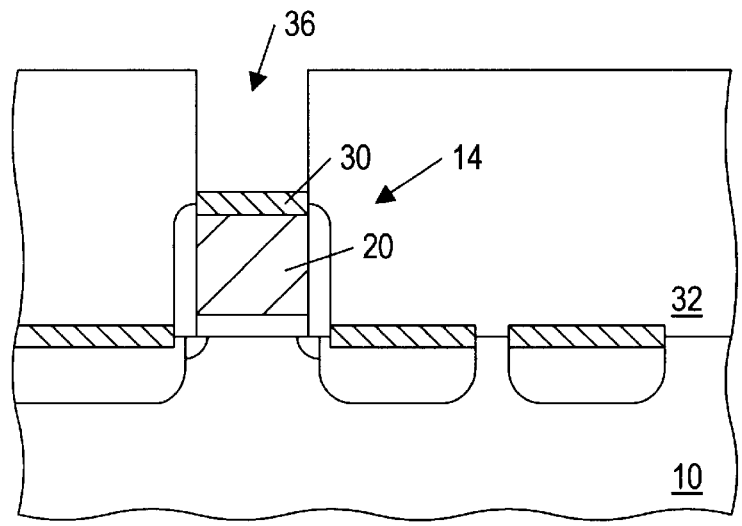
FIG. 4 is a partial cross-sectional view of the semiconductor substrate having an opening formed through the interlevel dielectric to a silicide region formed at the upper surface of the first transistor gate conductor according to a processing step subsequent to FIG. 3.

Referring to FIG. 4, a processing step subsequent to FIG. 3 is shown. FIG. 4 depicts an opening 36 which extends entirely through interlevel dielectric 32 to the upper surface of silicide 30. Opening 36 is contained only to the silicide upon the first transistor gate conductor 20. Opening 36 is produced by placing a masking layer across dielectric 32 and then patterning the masking layer such that the region to be opened is exposed. The exposed region is then subjected to an etch which, according to one embodiment, is a dry (anisotropic) etchant.

The etchant cycle continues for a time sufficient to remove all of interlevel dielectric 32 directly above suicide 30. The etchant composition is chosen so that it is selective to removing dielectric 32 but to a lesser degree silicide 30. Various etchant species used for achieving that purpose are generally well known, all of which achieve a fairly straight side wall surface characteristic of an anisotropic etch.

Figure 5:
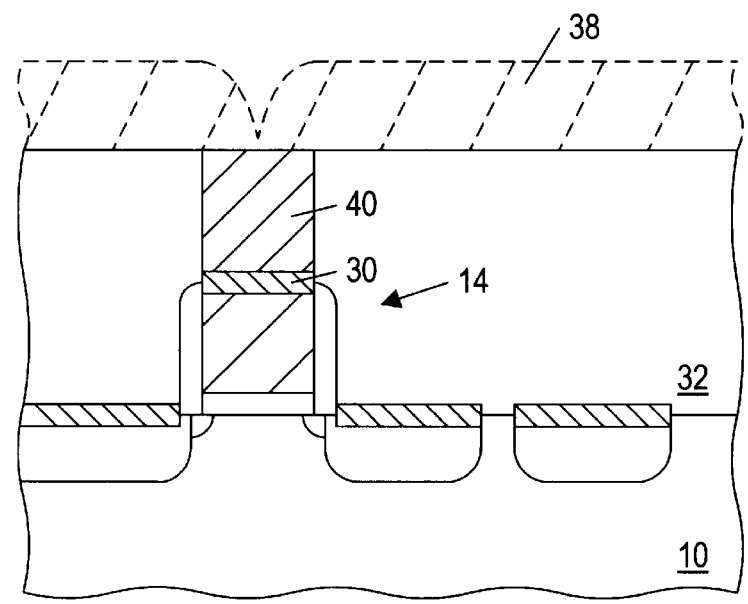
FIG. 5 is a partial cross-sectional view of the semiconductor substrate having polysilicon deposited into the opening and subsequently removed from the interlevel dielectric surface according to a processing step subsequent to FIG. 4.

Referring to FIG. 5, opening 36 is filled with a polycrystalline ("polysilicon") material 38. Polysilicon 38 fills opening 36 by blanket depositing a layer of polysilicon to a thickness which is greater than the depth of opening 36. Thereafter, the upper regions of the polysilicon layer are removed using, for example, CMP. Removal continues for a time sufficient to retain polysilicon 38 only within the confines of opening 36. The retained polysilicon 38 is henceforth referred to as the gate conductor 40 of a second, upper level transistor. After CMP, a blanket implant is performed to dope polysilicon 38 to render it conductive.

Figure 6:
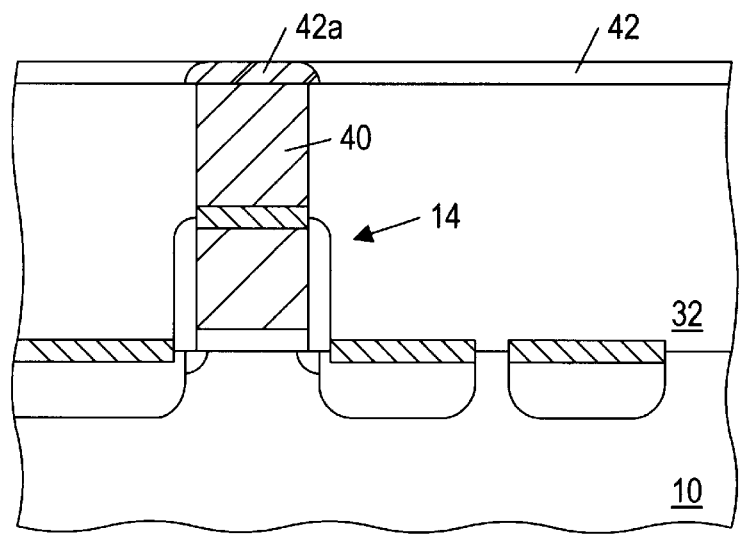
FIG. 6 is a partial cross-sectional view of the semiconductor substrate having a gate dielectric formed upon the retained polysilicon and, if desired, also upon the interlevel dielectric adjacent the retained polysilicon according to a processing step subsequent to FIG. 5.

FIG. 6 illustrates a processing step subsequent to FIG. 5 wherein a dielectric 42 is formed across the upper surfaces of interlevel dielectric 32 and gate conductor 40, according to one embodiment. Dielectric 42 can be CVD deposited. The deposited dielectric may be chosen to contain a nitrogen species. According to another embodiment, dielectric 42 is formed only in regions directly above gate conductor 40. In the later instance, dielectric 42 is denoted as reference numeral 42a, wherein dielectric 42a can be grown from the silicon-based gate conductor 40. Regardless of the method used in producing dielectric 42 and/or 42a, the result is the same: to separate gate conductor 40 from a overlying substrate produced in accordance with the processing step shown in FIG. 7.

Figure 7:
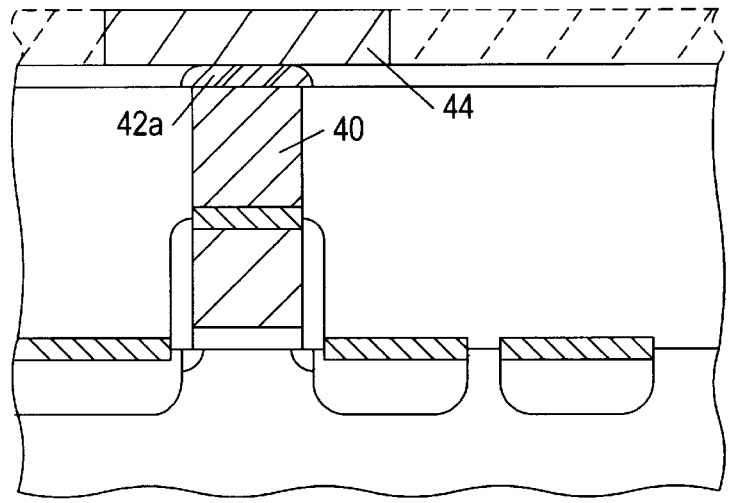
FIG. 7 is a partial cross-sectional view of the semiconductor substrate having a polysilicon substrate formed above the second transistor gate conductor as well as upon regions adjacent the gate conductor according to a processing step subsequent to FIG. 6.

FIG. 7 illustrates a silicon-based substrate 44 formed across only select regions of interlevel dielectric 32. More specifically, substrate 44 is formed by depositing a layer of polysilicon, and then removing portions of that poly silicon except for areas directly above gate conductor 40 and gate dielectric 42a. The retained portions of polysilicon substrate 44 is centered directly above gate conductor 40 and gate dielectric 42, but also extends laterally from the upper surfaces of the gate dielectric. The amount of lateral extension onto adjacent interlevel dielectric 32 can vary. Substrate 44 is defined as having a thickness sufficient to receive source/drain junction implants which extend downward to the bottom surface of substrate 44, or lower. If desired, and it usually is desired, a threshold adjust implant and possibly a punch through implant is incorporated into substrate 44 prior to source/drain formation.

Figure 8:
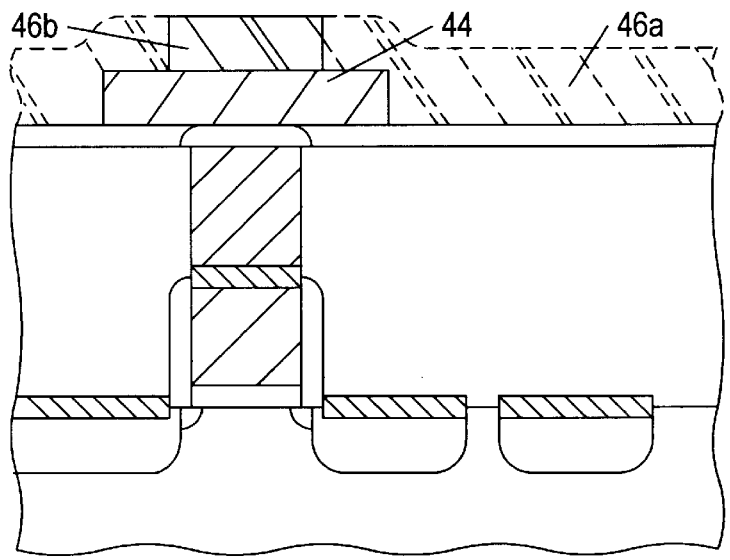
FIG. 8 is a partial cross-sectional view of the semiconductor substrate having a masking material patterned in a limited region near the center of the substrate according to a processing step subsequent to FIG. 7.

FIG. 8 depicts a processing step whereby a masking material 46 is deposited across the entire upper topography. Portions of that masking material are removed, and those portions are designated as reference numeral 46a. The retained portions 46b, however, exist only upon substrate 44. Retained masking material 46b exists only along a center region of substrate 44. The extremities of substrate 44 are thereby exposed as shown in FIG. 9.

Figure 9:
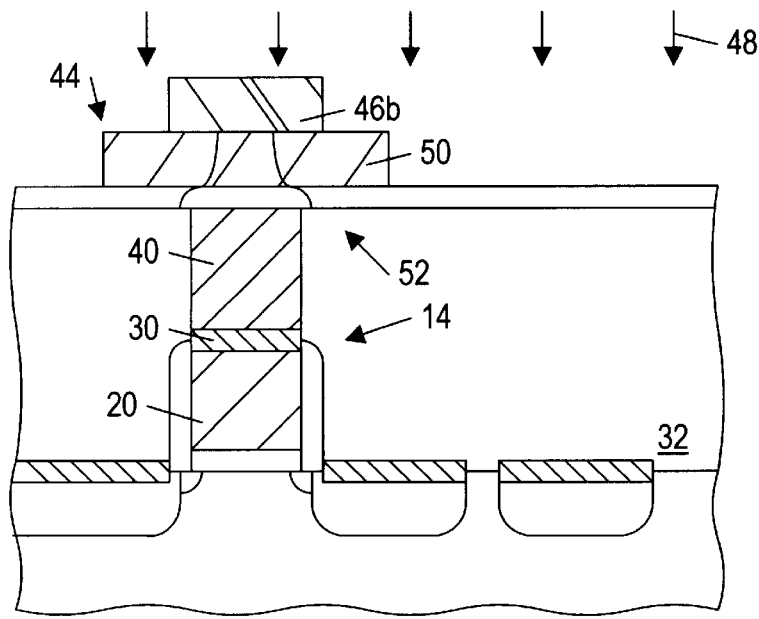
FIG. 9 is a partial cross-sectional view of the semiconductor substrate having implant species forwarded into the substrate in regions void of the masking material to conclude formation of the second transistor according to a processing step subsequent to FIG. 8.

FIG. 9 illustrates a processing step subsequent to FIG. 8, wherein source/drain implants are forwarded into substrate 44 in regions void of retained masking material 46b. Implants 48 extend into substrate 44 and form source/drain junctions 50. Junctions 50, in combination with gate conductor 40 and gate dielectric 42a, comprise a second transistor 52. Second transistor 52 comprises essentially the same features as first transistor 14. However, those features are inverted relative to the order in which features of first transistor 14 are formed. Further, features of second transistor 52 are confined entirely within or below substrate 44.

For sake of clarity, gate conductors 20 and 40 are not drawn to scale. The topological thickness and area of polysilicon which form those conductors can be adjusted depending upon the size of transistors 14 and 52 as well as the thickness of interlevel dielectric 32. It is not imperative that the relative features be drawn to scale or that dimensions be specified, all of which would be readily apparent to those skilled in the art given the benefits described herein. What is necessary, however, is that the second level gate conductor 40 be adjoined to first level gate conductor 20 is substantially no intermediate interconnect other than silicide 30. Further, the electrical connection between the gate conductors is made in the shortest possible manner. Rather than having to route the gate conductor of one transistor laterally across a topological surface to a gate conductor of another transistor, the gate conductors herein are stacked one upon each other using an inverted second transistor. Connection to the stacked gate conductors is performed in a dimension either behind or in front of the cross-sectional plane shown in FIG. 9.

Substrate 44 of second transistor 52 receives various dopants to render the substrate (or well) semiconductive. Preferably, substrate 44 comprises polysilicon, and polysilicon is exposed along a separate surface to receive all the various implants necessary to form junctions and channels. According to an alternative embodiment, substrate 44 can, if desired, be forwarded into the opening 36 shown in FIG. 4. Substrate 44 therein can receive dopants using a masking layer similar to the step shown in FIG. 9. In this alternative arrangement, the second substrate 44 is confined within the opening directly upon gate conductor 20. Thus, instead of using a silicide 30, the latter arrangement forgoes silicide and allows growth of a gate oxide instead. The gate oxide is therefore drawn between the shared gate conductor 20 and the substrate material deposited into opening 36. In this configuration, only a single polysilicon gate conductor 20 need be fabricated. While the alternative configuration may be used, it is desired that a silicide be used, and two gate conductors 20 and 40 be arranged on opposing sides of the silicide 30. Moreover, it is desirable that second substrate 44 be dimensioned outside of opening 36 into which second gate conductor 40 exists.

Figure 10:
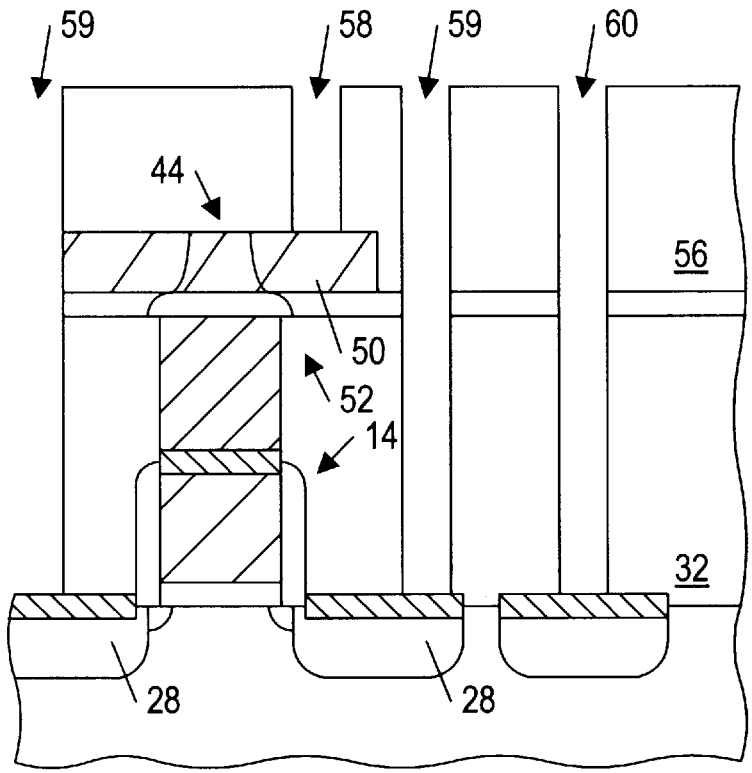
FIG. 10 is a partial cross-sectional view of the semiconductor substrate having the masking material entirely removed and a second interlevel dielectric placed upon and selectively removed according to a processing step subsequent to FIG. 9.

FIG. 10 illustrates a processing step subsequent to FIG. 9 whereby another interlevel dielectric 56 can be fashioned upon second transistor 52 and the lateral topography into which and upon which transistor 52 occurs. Dielectric 56 can be planarized, similar to the technique used to planarize dielectric 32. Accordingly, dielectric 56 affords an opportunity to introduce openings 58 to junctions 50 of the upper transistor as well as openings 59 to junctions 28 of the lower transistor, Openings 60 can also extend to the upper surface of well-tie areas 29. Depending upon where contact is to be made, the vertical distance of openings 58–60 can vary. However, in each case, the length of the various openings depend upon the thickness of first and second interlevel dielectrics 32 and 56, respectively.

Figure 11:
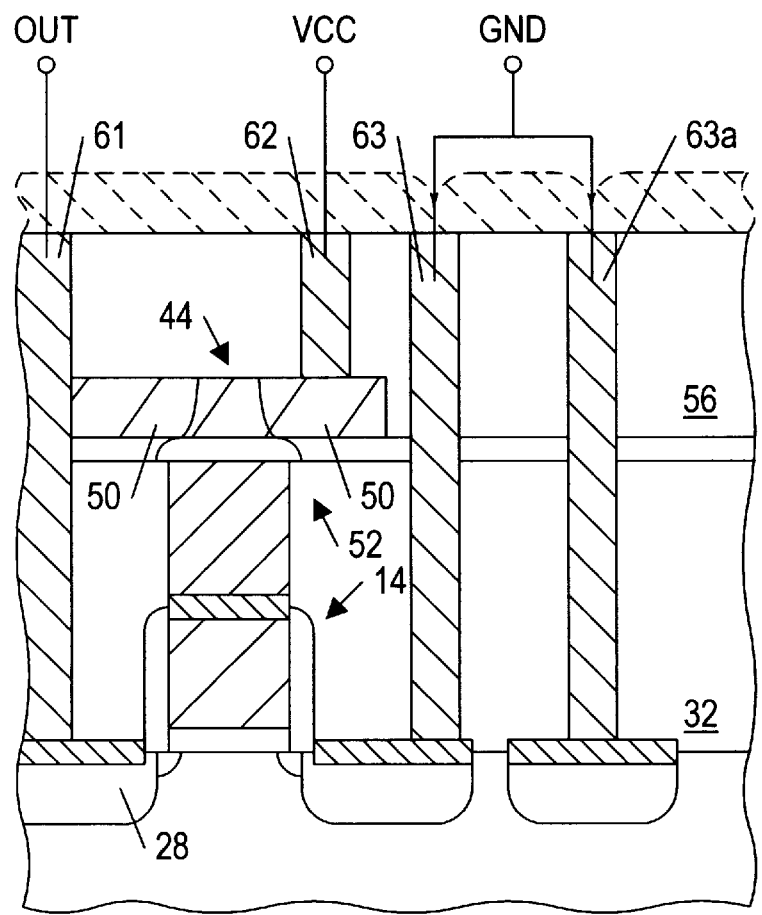
FIG. 11 is a partial cross-sectional view of the semiconductor substrate having a conductive material deposited in the removed regions of the first and second interlevel dielectric to conclude formation of junction vias (i.e., an output conductor, power conductor and ground conductor) according to a processing step subsequent to FIG. 10.

Openings 58–60 are filled with conductive material as shown in FIG. 11. Filling the openings form junction vias which are electrically conductive. The conductive vias serve as interconnect which extend along a vertical axis (or along an axis perpendicular to the topological surfaces on which transistors 14 and 52 exist). The interconnect serves to couple a junction of a lower level transistor to a junction of an upper level transistor, couple a junction of an upper or lower transistor to a power supply, and couple a junction of an upper or lower transistor to ground. The various conductors formed by filling openings 58–60 are shown as output, power (VCC) and ground conductors.

FIG. 11 illustrates an output conductor 61 which extends from an upper surface of junction 28 to a lateral surface of a junction 50. By forcing the layout of upper transistor 52 such that a lateral edge of junction 50 resides over (or slightly offset from) a middle region of junction 28, output conductor 61 can be formed in the shortest possible fashion. In the embodiment shown, transistor 52 is indicative of a PMOS transistor, for example. Likewise, transistor 14 is indicative of an NMOS transistor. Junctions 28 and 50 are drain implant areas of transistor pairs which electrically connect with an output conductor 61. The source implant junctions 50 and 28 are respectively coupled to a power conductor 62 and a ground conductor 63. The etchant used to remove interlevel dielectrics and the conductive material used to fill the resulting openings are generally known to those skilled in the art. Depending upon the opening aspect ratio, the conductive material can vary in its flowability and commensurately in its resistivity. Given that transistor 14 is NMOS and transistor 52 is PMOS, and given the interconnect as shown, transistors 14 and 52 form an inverter. The inverter and specifically transistor 14 is optimally arranged. The well or "body" of transistor 14 is biased to a ground voltage by interlinking ground conductor 63 with similarly formed ground conductor 63a. Biasing the body causes a change in the workfunction difference between the gate material and the bulk silicon in the channel. In essence, biasing the body of an NMOS device to ground voltage will force the threshold voltage more positive, and more importantly, will force the threshold voltage to be more consistent given the relatively constant bias being applied to the respective transistor body. A consistent turn-on threshold that does not deteriorate at smaller geometries is at least one benefit provided by grounding the body or well of transistor 14.

Depending upon the number of levels needed, numerous other transistors can therefore be stacked almost endlessly into a third dimension to allow multi-level device fabrication thereof. It will be appreciated to those skilled in the art having the benefit of this disclosure that the present process methodology is capable of producing PMOS and/or NMOS devices in three dimensions. Preferably, a PMOS device is stacked directly upon an NMOS device, yet inverted from that NMOS device. Alternatively, a NMOS device can be stacked (and inverted) upon a PMOS device. In either instance, stacking PMOS and NMOS devices affords ready linkage of their gates and interconnect of their junctions amongst one another and to the power and ground conductors associated with the ensuing wafer. Thus, the first and second transistor shown in the above figures are of opposite type so that gate conductor 40 of second transistor 52 is doped opposite gate conductor 20 of first transistor 14. This ensures an ohmic contact at silicide 30. This ohmic contact provides that both polysilicon gates will be at the same bias—a desired outcome in circuit applications.

If for example, second transistor 52 is a PMOS transistor, then implant 48 (shown in FIG. 9) is a p-type implant. Of course, implicit in this implant is the occurrence of dopant placed within second gate conductor 40. This pre-existing dopant within conductor 40 occurs by implanting the conductor after the steps shown in FIG. 5 and before the deposition/growth of oxide shown in FIG. 6.

Various modifications and changes may be made to each and every processing step without departing from the spirit and scope of the invention provided the interconnect concepts set forth in the claims are retained. It is intended that the following claims be interpreted to embrace all such modifications and changes, and accordingly, the specification and drawings are to be regarded in an illustrative rather than a restrictive sense.

What is claimed is:

1. An integrated circuit comprising:
    a first transistor having a first source implant, a first drain implant and a first gate conductor arranged upon a first topography;
    a first interlevel dielectric extending over said first topography, said first interlevel dielectric having an opening which exposes the first gate conductor;
    a second transistor having a second source implant, a second drain implant and a second gate conductor which extends over said first interlevel dielectric, wherein said second gate conductor extends below said second source and drain implants and into said opening in electrical abutment with said first gate conductor;
    an output conductor abutting an outermost lateral edge of said second drain implant and extending from said outermost lateral edge to an upper surface of said first drain implant;
    a power conductor spaced substantially parallel to said output conductor and abutting an upper surface of said second source implant; and
    a ground conductor spaced substantially parallel to said output conductor and said power conductor and abutting an upper surface of said first source implant.

2. The integrated circuit as recited in claim 1, wherein said integrated circuit comprises an inverter.

3. The integrated circuit as recited in claim 2, wherein said output conductor, said power conductor and said ground conductor are connected between said first and second transistors to form an inverter.

4. The integrated circuit as recited in claim 2, wherein said output conductor, said power conductor and said ground conductor each extend along an axis perpendicular to said first topography.

5. The integrated circuit as recited in claim 1, wherein said second transistor is inverted relative to said first transistor.

6. The integrated circuit as recited in claim 1, further comprising a silicide interposed between said first gate conductor and said second gate conductor.

7. The integrated circuit as recited in claim 1, wherein said second drain and source implants are doped with an impurity opposite said first drain and source implants.

8. The integrated circuit as recited in claim 1, wherein said second gate conductor completely fills said opening, such that an entire upper surface of the second gate conductor is substantially even with an upper surface of said first interlevel dielectric.

9. An inverter circuit, comprising:
    a first transistor having a first gate conductor, a first source implant and a first drain implant, wherein said first gate conductor extends along a plane above said first source and drain implants;
    a second transistor having a second gate conductor, a second source implant and a second drain implant, wherein said second gate conductor extends along a plane below said second source and drain implants, and wherein said second gate conductor abuts with said first gate conductor;
    an output conductor abutting an outermost lateral edge of said second drain implant and extending from said outermost lateral edge to an upper surface of said first drain implant;
    a power conductor spaced substantially parallel to said output conductor and abutting an upper surface of said second source implant; and
    a ground conductor spaced substantially parallel to said output conductor and said power conductor and abutting an upper surface of said first source implant.

10. The inverter as recited in claim 9, further comprising a silicide interposed between said first gate conductor and said second gate conductor.

11. The inverter as recited in claim 9, wherein said second drain and source implants are doped with an impurity opposite said first drain and source implants.

* * * * *